United States Patent
Quinn et al.

(10) Patent No.: US 12,492,461 B2
(45) Date of Patent: Dec. 9, 2025

(54) OVJP INJECTION BLOCK

(71) Applicant: Universal Display Corporation, Ewing, NJ (US)

(72) Inventors: William E. Quinn, Whitehouse Station, NJ (US); Craig Anthony Outten, Rydal, PA (US); Gregory McGraw, Yardley, PA (US); Xin Xu, Plainsboro, NJ (US)

(73) Assignee: Universal Display Corporation, Ewing, NJ (US)

( * ) Notice: Subject to any disclaimer, the term of this patent is extended or adjusted under 35 U.S.C. 154(b) by 705 days.

(21) Appl. No.: 17/831,495

(22) Filed: Jun. 3, 2022

(65) Prior Publication Data

US 2022/0403501 A1    Dec. 22, 2022

Related U.S. Application Data

(60) Provisional application No. 63/211,177, filed on Jun. 16, 2021.

(51) Int. Cl.
| | | |
|---|---|---|
| C23C 14/24 | (2006.01) | |
| B41J 2/14 | (2006.01) | |
| C23C 14/04 | (2006.01) | |
| C23C 14/12 | (2006.01) | |
| C23C 14/54 | (2006.01) | |

(52) U.S. Cl.
CPC ........... *C23C 14/04* (2013.01); *B41J 2/14145* (2013.01); *C23C 14/12* (2013.01); *C23C 14/24* (2013.01); *C23C 14/54* (2013.01)

(58) Field of Classification Search
None
See application file for complete search history.

(56) References Cited

U.S. PATENT DOCUMENTS

| | | |
|---|---|---|
| 4,769,292 A | 9/1988 | Tang |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |

(Continued)

FOREIGN PATENT DOCUMENTS

| | | |
|---|---|---|
| EP | 2865981 | 4/2015 |
| WO | 2008057394 A1 | 5/2008 |
| WO | 2010011390 A2 | 1/2010 |

OTHER PUBLICATIONS

Baldo et al. "Highly efficient phosphorescent emission from organic electroluminescent devices", Nature, vol. 395, pp. 151-154, 1998.

(Continued)

*Primary Examiner* — Jethro M. Pence
(74) *Attorney, Agent, or Firm* — Butzel Long (57) ABSTRACT

A deposition device including an injection block and a print die is provided, which allows for vertical movement of the injection block while still maintaining connection between the print die and external gas sources. Also disclosed is an injection block suitable for such devices, which provides improved vertical range of motion and thermal consistency compared to conventional injection block devices.

10 Claims, 4 Drawing Sheets

(56) References Cited

U.S. PATENT DOCUMENTS

| | | | |
|---|---|---|---|
| 6,087,196 A | 7/2000 | Sturm | |
| 6,091,195 A | 7/2000 | Forrest | |
| 6,097,147 A | 8/2000 | Baldo | |
| 6,239,686 B1 * | 5/2001 | Eder | H01H 37/323 |
| | | | 337/140 |
| 6,289,681 B1 * | 9/2001 | Eckels | G01R 33/3806 |
| | | | 62/51.1 |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 6,537,688 B2 | 3/2003 | Silvernail | |
| 6,597,111 B2 | 7/2003 | Silvernail | |
| 6,664,137 B2 | 12/2003 | Weaver | |
| 6,835,950 B2 | 12/2004 | Brown | |
| 6,888,305 B2 | 5/2005 | Weaver | |
| 6,888,307 B2 | 5/2005 | Silvernail | |
| 6,897,474 B2 | 5/2005 | Brown | |
| 7,187,119 B2 | 3/2007 | Weaver | |
| 7,279,704 B2 | 10/2007 | Walters | |
| 7,431,968 B1 | 10/2008 | Shtein | |
| 7,683,534 B2 | 3/2010 | Weaver | |
| 7,968,146 B2 | 6/2011 | Wagner | |
| 8,092,599 B2 * | 1/2012 | Sferlazzo | C23C 16/45589 |
| | | | 156/345.33 |
| 8,613,496 B2 * | 12/2013 | Forrest | B05B 1/02 |
| | | | 347/47 |
| 8,931,431 B2 * | 1/2015 | Forrest | C23C 14/12 |
| | | | 118/712 |
| 8,939,555 B2 * | 1/2015 | Forrest | B05B 1/02 |
| | | | 347/68 |
| 9,249,506 B2 * | 2/2016 | Forrest | C23C 16/54 |
| 9,797,039 B2 * | 10/2017 | Forrest | C23C 14/228 |
| 10,480,056 B2 * | 11/2019 | Forrest | C23C 14/04 |
| 10,704,144 B2 * | 7/2020 | McGraw | H10K 71/135 |
| 10,818,840 B2 | 10/2020 | Quinn | |
| 10,941,481 B2 * | 3/2021 | Forrest | C23C 14/12 |
| 10,998,531 B2 | 5/2021 | Quinn | |
| 11,002,663 B2 | 5/2021 | Kaidong | |
| 11,088,325 B2 | 8/2021 | McGraw | |
| 11,267,012 B2 | 3/2022 | McGraw | |
| 2003/0230980 A1 | 12/2003 | Forrest | |
| 2004/0099213 A1 | 5/2004 | Adomaitis | |
| 2004/0174116 A1 | 9/2004 | Lu | |
| 2010/0245479 A1 * | 9/2010 | Forrest | B41J 2/005 |
| | | | 347/47 |
| 2012/0070916 A1 * | 3/2012 | Sferlazzo | C23C 16/45589 |
| | | | 257/E21.53 |
| 2016/0158771 A1 * | 6/2016 | Forrest | B05C 5/0291 |
| | | | 118/302 |
| 2017/0229663 A1 | 8/2017 | Tsai | |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

OVJP INJECTION BLOCK

CROSS-REFERENCE TO RELATED APPLICATIONS

This application claims the benefit of U.S. Patent Application Ser. No. 63/211,177, filed Jun. 16, 2021, the entire contents of which are incorporated herein by reference.

FIELD

The present invention relates to devices and techniques for fabricating organic emissive devices, such as organic light emitting diodes, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
| --- | --- |
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; Interior: [0.2268, 0.3321] |

-continued

| Color | CIE Shape Parameters |
| --- | --- |
| Central Yellow | Locus: [0.3731, 0.6245]; [0.6270, 0.3725]; Interior: [0.3700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic vapor jet printing (OVJP) device includes a print die; and an injection block having an internal recess entirely within the injection block and an internal gas distribution manifold to distribute carrier gas and/or vacuum to the print die. A flexible bellows may be disposed within the internal recess within the injection block and in fluid communication with the internal gas distribution manifold, which allows the injection block to move at least 150 µm, 300 µm, or more vertically relative to a fixed-position gas distribution system while maintaining a fluid connect between the print die and the injection block. The injection block may be made from a monolithic block of material, with the internal gas distribution manifold formed from one or more channels machined into the monolithic block of material. An inner seal may be placed over the recess, in fluid communication with a first end of the flexible bellows and with the internal gas distribution manifold. The internal recess may be disposed adjacent to an outer surface of the injection block, and may further include an outer seal to seal the internal recess from the outer ambient environment and retain heat within the internal recess. An input tube may be connected to, and in fluid communication with, the bellows and with a source of carrier gas and/or organic vapor material. The input tube may be sufficiently large to allow for commercial-scale operation, for example having an inner diameter of at least 0.635 cm, 0.7 cm, or more. A heating element may be used to maintain a temperature within the injection block with a variation of 2 C or less. The print die also may be formed from a monolithic block of material, and may include channels etched in the monolithic block and in fluid communication with the internal gas distribution manifold of the injection block.

According to an embodiment, an injection block is provided having the properties previously disclosed, including the ability to maintain a temperature variation of 2 C or less during operation, and allowing for vertical movement of 150 µm, 300 µm, or more relative to a substrate.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
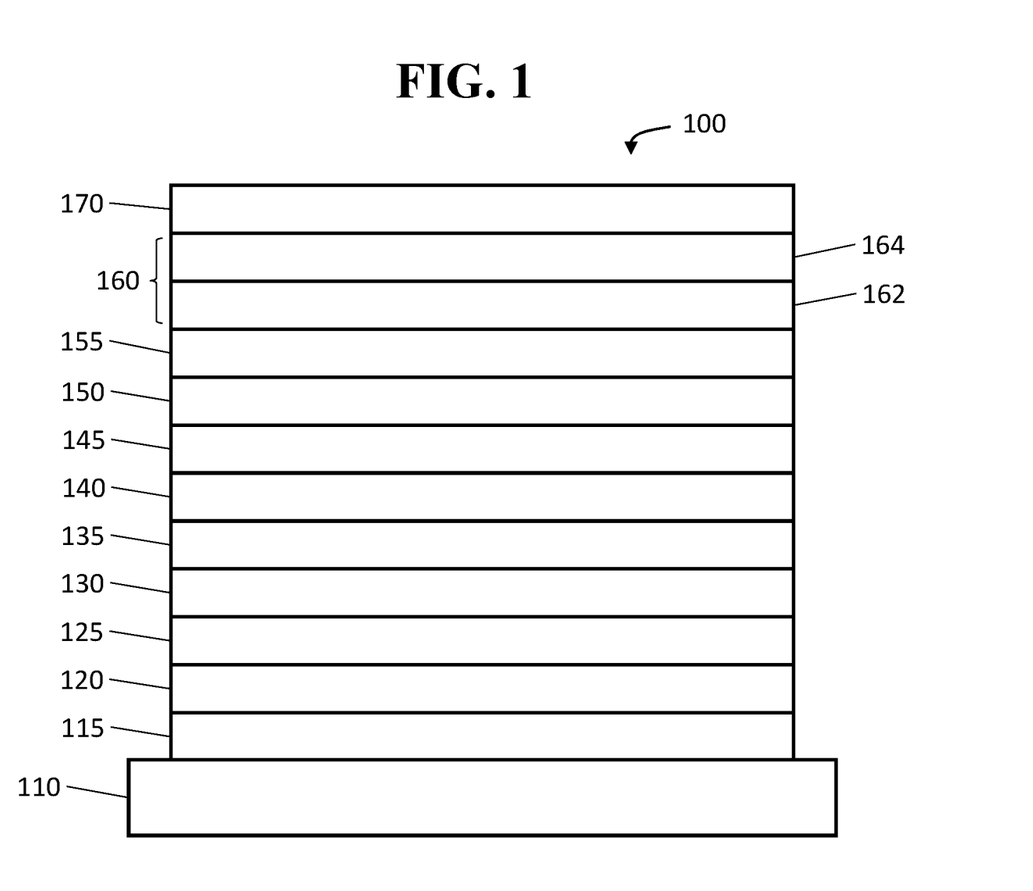
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. Barrier layer 170 may be a single- or multi-layer barrier and may cover or surround the other layers of the device. The barrier layer 170 may also surround the substrate 110, and/or it may be arranged between the substrate and the other layers of the device. The barrier also may be referred to as an encapsulant, encapsulation layer, protective layer, or permeation barrier, and typically provides protection against permeation by moisture, ambient air, and other similar materials through to the other layers of the device. Examples of barrier layer materials and structures are provided in U.S. Pat. Nos. 6,537,688, 6,597,111, 6,664,137, 6,835,950, 6,888,305, 6,888,307, 6,897,474, 7,187,119, and 7,683,534, each of which is incorporated by reference in its entirety.

Figure 2:
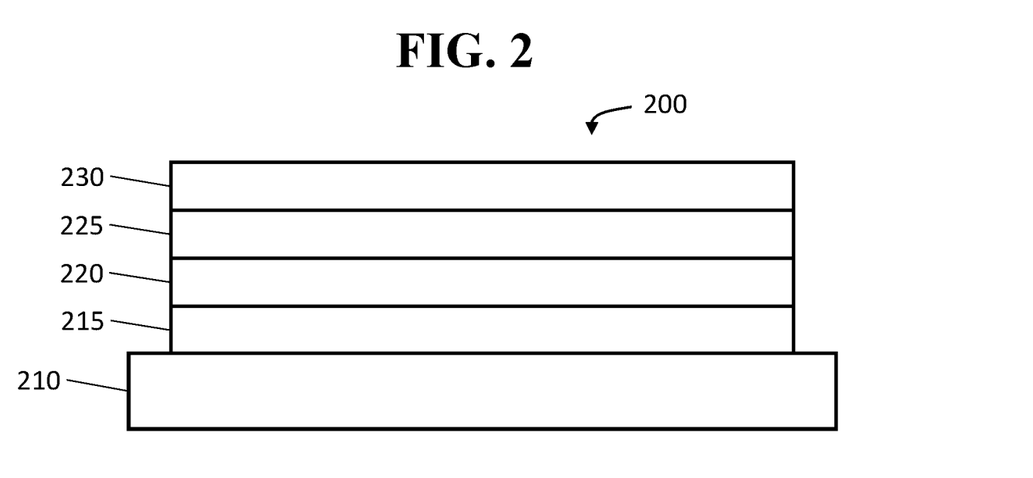
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. In general, an emissive layer includes emissive material within a host matrix. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light based on an injected electrical charge, where the initial light may be altered by another layer such as a color filter or other color altering layer that does not itself emit an initial light within the device, but may re-emit altered light of a different spectra content based upon absorption of the initial light emitted by the emissive layer and downconversion to a lower energy light emission. In some embodiments disclosed herein, the color altering layer, color filter, upconversion, and/or downconversion layer may be disposed outside of an OLED device, such as above or below an electrode of the OLED device.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a pluraility of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL

A hole injecting/transporting material to be used in the present invention is not particularly limited, and any compound may be used as long as the compound is typically used as a hole injecting/transporting material.

EBL

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, OVJP systems and techniques may be used to fabricate OLEDs and similar devices. In contrast to other deposition techniques, OVJP allows for the printing of fine lines of organic material onto a substrate such as a display backplane without the use of fine metal shadow masks or liquid solvents. Other techniques typically employed to produce displays such as those used in mobile and laptop devices uses evaporation sources and fine metal masks to pattern the deposition. Fine metal masks are not suitable for use in manufacturing larger-area displays because the masks cannot be stretched with sufficient force to prevent sagging. Ink jet printing is a potential patterning technique for OLED displays, but the use of solvents to make the inks seriously degrades the performance of the light emitting devices. OVJP eliminates these two issues by printing lines of pixel width without the use of fine metal masks and uses state of the art OLED materials without dissolving them in solvent.

In OVJP, OLED materials are heated in an enclosed container to an elevated sublimation temperature and transported through heated gas lines using an inert carrier gas. The print head contains jetting apertures with a spacing that corresponds to the pixel spacing of the display. For example, apertures may be formed in silicon wafers using MEMS fabrication techniques. Functional OVJP die are then cut from the wafer, with the apertures along one face of the die. During the deposition process, the sublimated material is directed at the backplane substrate and excess organic material and/or carrier gas may be removed from the printing area by vacuum channels inserted into the print die.

Carrier gas and exhaust tubing supplying an OVJP injection block are heated to between 250C and 450C; the temperature is determined by the sublimation temperature of the organic material that is printed. The injection block and print die are also heated to these temperatures to prevent condensation of organic material in the block and die. To print fine lines of pixel width on a substrate, the print die is maintained in close proximity to the substrate surface. The distance between the print die and the substrate typically is 15 µm to 60 µm and the distance typically should be controlled to within 1 µm of the set distance to achieve acceptable deposition profiles. To start and stop deposition at the beginning and end of a pixel row, the injection block is lowered or raised from a standby position that is greater than 250 µm above the substrate surface. Vertical motion of the injection block requires flexible elements in the gas and vacuum tubing attached to the block and the flexible elements must be heated to prevent condensation.

The gap between the print die and the surface of the backplane may be accurately controlled by measuring the gap in real time and moving the print head vertically relative to the surface of the backplane substrate and/or relative to a fixed-position gas distribution system. As described above, organic material is supplied to the print head in a saturated gas stream at elevated temperature and excess organic material is removed by vacuum channels in the print die. Carrier gas and vacuum connections to the print die typically are made with metal tubes. The silicon print die is attached to an injection block that contains an internal manifold to distribute carrier gas and vacuum to the print die. Gas and vacuum tubes from the external material and vacuum sources are hermetically attached to the injection block. For a commercial production-size printing system, the tubing must have sufficient capacity to supply and evacuate large volumes of gas; this typically requires tubing diameters greater than ¼ inch (0.635 cm) in diameter. Tubing of this diameter is not sufficiently flexible to enable motion of the injection block and print die to follow the surface of the substrate without the addition of a flexible element. This prevents or complicates the use of conventional OVJP systems in fabricating large-scale displays, since the larger print head is not able to maintain a sufficiently precise position relative to the backplane substrate. Further, it is desirable in OVJP systems to use all metal gas delivery systems so that the purity of the gas delivered by the system can be maintained. Metal tubing and bellows do not add contaminants to the gas stream as an organic polymer hose would. In high vacuum chambers polymeric organic materials outgas impurities and contaminate the vacuum atmosphere. Using all metal, typically stainless steel, gas lines and bellows contamination can be eliminated.

Flexible formed or welded bellows could be added to the gas and vacuum lines to allow for movement between the ends of the lines. This would be straightforward if the lines did not need to be heated; however, in OVJP, the gas and vacuum lines need to be heated to prevent condensation of sublimated organic material being transported to the injection block. Bellows and similar structures are difficult to heat for two main reasons: first, the irregular surface of the bellows is difficult to replicate in a contact heater design; and second, particles are created when heater and bellows surfaces wear against each other when the bellows flexes. Embodiments disclosed herein reduce or eliminate the need for a conformal heater and the creation of undesirable particles in the system.

Flexible metal bellows are used for high purity tubing applications where some degree of flexibility of the tubing is required and for high vacuum applications where a polymer tube could degrade the purity of the vacuum atmosphere. Where metal tubing needs to be heated to prevent condensation within the tubes, conventional systems use a resistive tape like heat wrap which is applied to the bellows and covered by some form of insulation. This approach is sufficient for fixed tubing, but it does not work for moving bellows as used in embodiments disclosed herein. The bellows has an irregular surface which is difficult to cover by heat tape, and when the bellows flexes, the heat tape loses contact with the bellows surface and often restricts movement of the bellows. Further, although insulation improves the heat retention of the bellows, it also rubs the surface of the bellows when the bellows is flexed and creates particles which would be undesirable in an OVJP system. An alternate technique is the use of conformal heat jackets that mate to the outside of the tubing. These conformal heaters include resistance heaters and thermal insulation. These techniques also do not work well for flexible bellows, as the heat tape hinders the bellows motion if it is wrapped tightly and creates particles as the bellows and heat tape move relative to each other. A conformal heat jacket would render the bellows not flexible. If the bellows is not wrapped tightly, heat is not transferred efficiently to the bellows and results in the bellows being cooler than the tubing attached to the bellows. Adding insulation over the heat tape further hinders the bellows motion.

Accordingly, embodiments disclosed herein use a non-contact heated recess formed within the OVJP injection block to heat the flexible bellows without the need for heat tapes or additional insulation. In this arrangement the injection block serves as an oven to uniformly heat the bellows without hindering motion or creating particles.

Figure 3A:
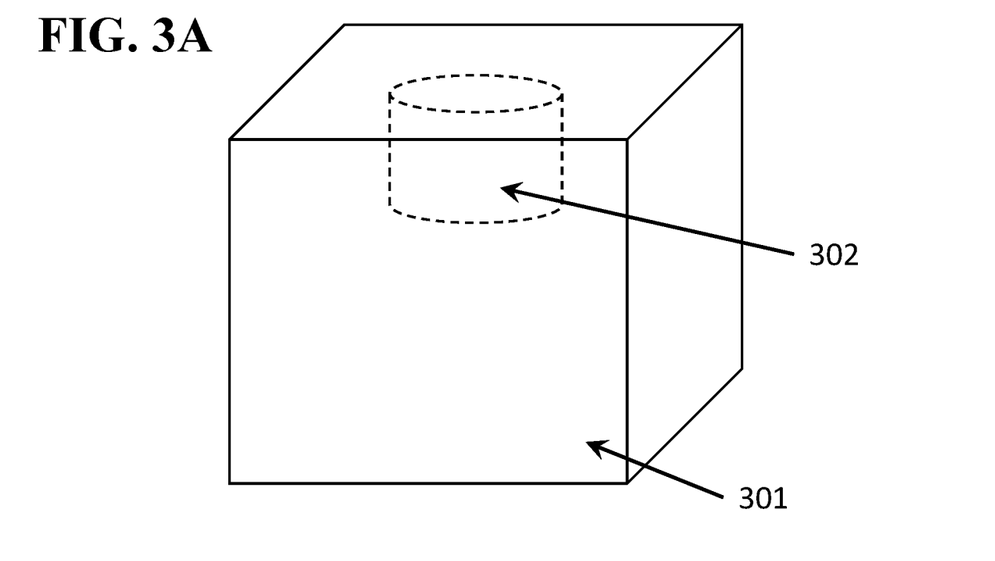
FIGS. 3A, 3B, and 3C show perspective, side, and top schematic illustrations, respectively, of an injection block as disclosed herein.
Figure 3B:
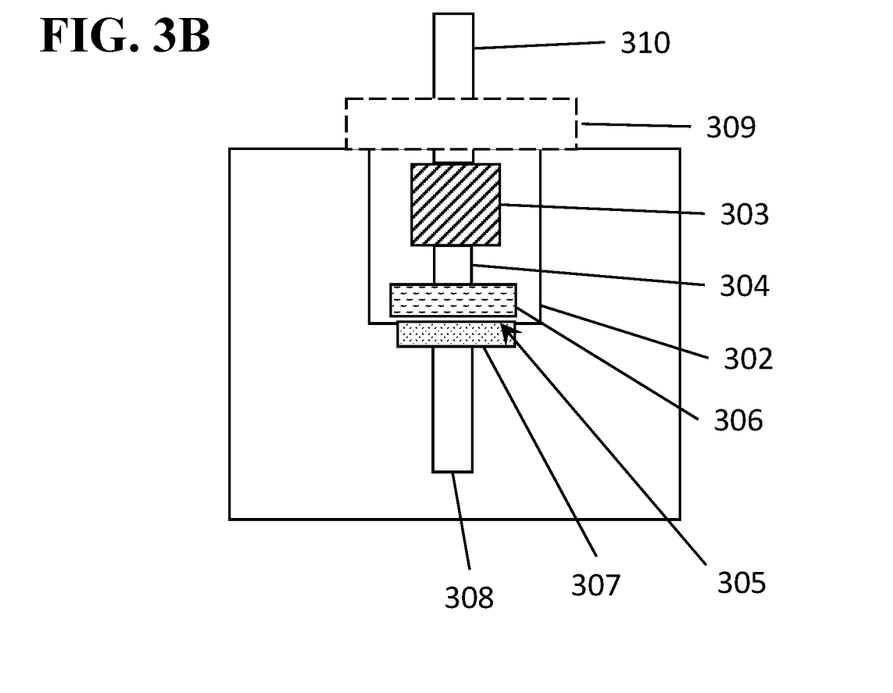
Figure 3C:
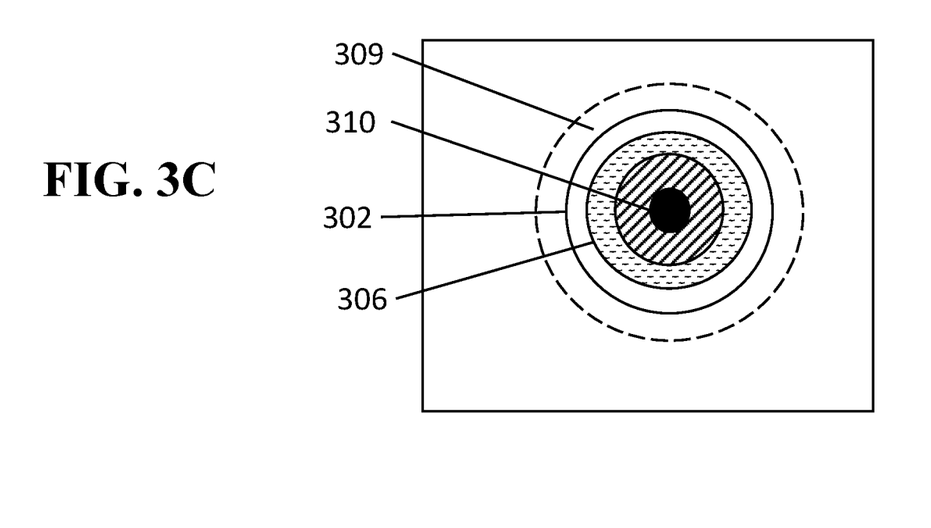

FIGS. 3A, 3B, and 3C show perspective, side, and top schematic views, respectively, of an example of a heated injection block 301 as disclosed herein with a milled recess 302. The recess 302 may be any suitable shape and dimension within the injection block 301, though generally it is preferable for the recess 302 to be no larger than necessary to contain the features described with respect to FIGS. 3B and 4 to improve heating of the recess and components within. For example, for a commercial system, the recess may be have dimensions similar to the bellows, such that the walls of the bellows are within 2 mm or less of the outer edge of the bellows. Further, because the injection block may be made from a monolithic block of uniform material, the recess 302 and the injection block 300 as a whole may be maintained at a very consistent temperature. For example, during typical operation such as for OVJP deposition, the injection block may be maintained at a uniform, consistent temperature with a variation of 2 C, 1.75 C, 1.5 C, 1.25 C, 1 C, or less. The temperature may be maintained through use of one or more heaters and/or one or more temperature sensors, which may be configured for automatic control to provide more or less heat during operation of the system. Although the use of heaters and temperature sensors generally may be known in conventional systems, such systems generally are unable to provide the same range of vertical motion as embodiments disclosed herein, or still exhibit larger temperature variation even when under sensor-based control due to the need to heat and insulate flexible tubing or equivalent features, which do not have the same thermal consistency as a monolithic injection block as disclosed herein.

FIGS. 3B and 3C show the bellows concept and details of the recess. The recess 302 may be sealed by a sealing surface 307 in fluid communication with the injection block internal gas distribution network 308. The flexible bellows 303 may be welded to a short tube 304 and a rotatable seal assembly 306. The seal face 305 matches the seal formed in the injection block recess 302 and may be, for example, an all-metal seal such as a conflat, a VCR high purity gas connection as available from Swagelok, a C-seal, or the like. The opposite end of the bellows 303 may be welded to a heated input tube 310 in fluid communication with the organic source (not shown). A two-part cover 309 may be bolted to the injection block to retain heat in the cavity. A clearance hole in the cover 309 allows the bellows to flex without creating particles. The input tube 310, bellows 303, and other components may have any suitable dimension. However, for commercial-scale devices, it may be desirable for the input tube 310 to have an inner diameter of at least 0.635 cm (0.25 in), 0.7 cm, or more, to allow for a sufficient volume flow of organic material-laden carrier gas and exhausted gas through the injection block.

Figure 4:
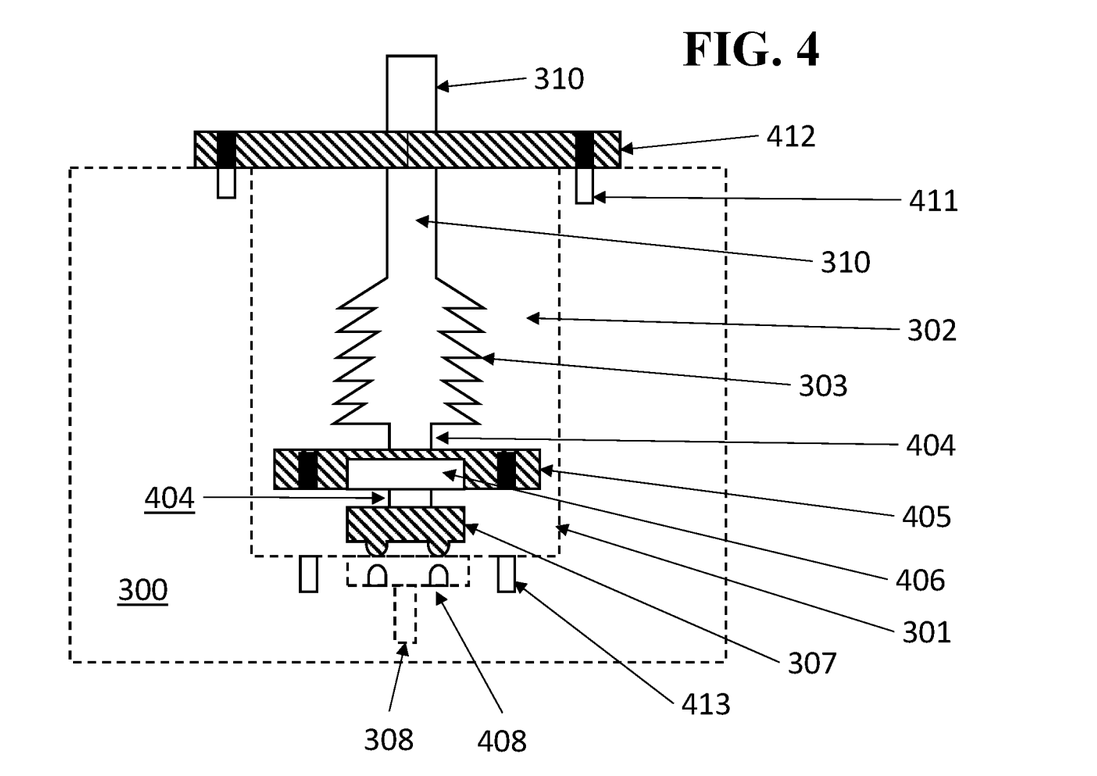
FIG. 4 shows another example of an injection block arrangement as disclosed herein.

FIG. 4 shows a detailed view of an example injection block bellows assembly as disclosed herein. The heated injection block 300 contains a recess 301 as previously disclosed. A sealing surface 408 fabricated in one surface that is in fluid communication with the gas distribution network 308 in the injection block. The bellows assembly includes a sealing plate 307 as previously disclosed, with a sealing surface that matches the sealing surface in the recess. A flange 405 which contains a recess 406 to accept and align the sealing plate may be bolted or otherwise connected directly to threaded holes 413 in the recess. The sealing plate 307 may be welded to a short tube 404 that is welded to a flexible bellows 303. The opposing end of the bellows is welded to a heated input tube 310 which is in fluid communication with the source of organic vapor. The heated tube may be insulated to prevent heat loss. A sealing plate 412 has a central clearance hole to allow the input tube 310 to move in the same direction as the axis of the bellows. The sealing plate 412 may be bolted or otherwise connected directly to threaded holes 411 in the injection block. The sealing plate can be one piece or split to make installation easier. The cover plate functions to keep heat in the recess to evenly heat the bellows.

The bellows 303 in embodiments such as shown in FIGS. 3-4 allows for vertical movement of the injection block relative to a substrate on which material is to be deposited and/or relative to a fixed-position gas distribution system such as the carrier gas source and/or vacuum source to which the injection block is connected, while maintaining the gas line connections between the injection block and a print die, and between the injection block and the external sources of material-laden carrier gas and/or vacuum. In commercial-scale devices, the bellows allows for vertical movement of at least 150 μm, 200 μm, 250 μm, or 300 μm while maintaining these connections. Further, because the bellows is disposed within the injection block and the injection block is uniformly heated by one or more heaters to a temperature sufficient to prevent condensation of the organic material entrained in the carrier gas moving through the bellows, the use of the bellows does not increase the likelihood of condensation when compared to a conventional injection block or a system that uses conventional alternatives such as flexible tubing, serpentine gas lines, or the like, which are disposed outside the injection block and require additional heating and insulation as previously disclosed. A flexible bellows as disclosed herein also requires less space within the deposition system compared to conventional alternatives, further improving the ability to maintain a desired and consistent temperature throughout the flow path of the organic material.

In embodiments as shown in FIGS. 3-4, the injection block 301 includes a distribution manifold which routes organic-laden carrier gas and a vacuum source to a silicon MEMS-fabricated print die. The injection block 301 and/or the print die may be fabricated from metal, ceramic or glass. In the case of ceramics or glass, threaded holes in the block may be replaced by through holes and flanges may be attached with bolts and nuts. A silicon print die may be attached to the injection block using crushable metal seals and a backing pressure plate, metallic solder, frit bonding, or any other suitable attachment mechanism as known in the art. The injection block 301 may be fabricated from a monolithic block of uniform material, for example by bonding silicon wafers in which the desired gas lines and other features have been machined or otherwise created prior to bonding.

Embodiments disclosed herein may be particularly suited to OVJP in contrast to other deposition techniques such as atomic layer deposition (ALD), chemical vapor deposition (CVD), and the like. One difference between OVJP and other techniques is the temperatures at which each part of the deposition system operates in order to maintain desired pressures, material state, gas or other material flow, and the like. For example, OVJP typically uses temperatures of 200-500 C for source crucibles and the gas run lines between source material containers and the print head, and temperatures of 0-80 C for the substrate on which material is to be deposited. This is significantly different from other deposition techniques, which typically use heated substrates and different combinations of temperatures and pressure variations throughout the deposition system. For example, ALD and various CVD processes typically use gas run line temperatures of 25-150 C. At these temperatures, OVJP materials likely would exhibit a large degree of condensation within the gas lines. ALD and variations of CVD techniques also use much higher substrate temperatures, typically 25-800 C for ALD and 600-1200 for conventional CVD processes. Some CVD techniques may use slightly lower temperature, such as plasma-enhanced CVD (PECVD) which can operate in the 200-400 C range when depositing oxides, nitrides, and other materials for semiconductor, optoelectronic, or similar uses, or 25-400 C for non-semiconductor applications. Low-pressure CVD (LPCVD) typically operates in the 400-900 C range for semiconductor and optoelectronic devices. Even where CVD-based techniques may use substrate temperatures that may overlap acceptable ranges for OVJP processes, the devices and systems would not be suitable for OVJP use due to the likelihood of the deposition system transmitting heat to the substrate, which would damage organic materials on the substrate and/or prevent proper deposition of organic materials entrained in the carrier gas. Accordingly, as used herein, an "OVJP deposition system" or "OVJP system" or other OVJP component excludes devices and systems designed and intended for use with ALD, CVD, or similar non-OVJP processes. Furthermore, as previously described, an OVJP system typically operates at different temperature ranges and combinations of temperature ranges for the gas transfer lines and substrate than are used in other processes. Accordingly, an OVJP system as disclosed herein may be distinguished from other depositions systems in that it is both configured to, and capable of, operating in OVJP temperature ranges as disclosed without damaging the system, the substrate, or the materials being deposited on the substrate.

Embodiments disclosed herein also may be suited for fabricating OLED displays using OVJP, which can achieve 160 dpi resolution at 25 μm per pixel, printed directly on the substrate without the use of a mask. As a specific example, for a 4K display, a fly height (substrate-print die separation) of 10-60 μm with a tolerance of 0.5 μm may be used, with a 10 μm separation between adjacent sub-pixels deposited on the substrate.

Figure 5:
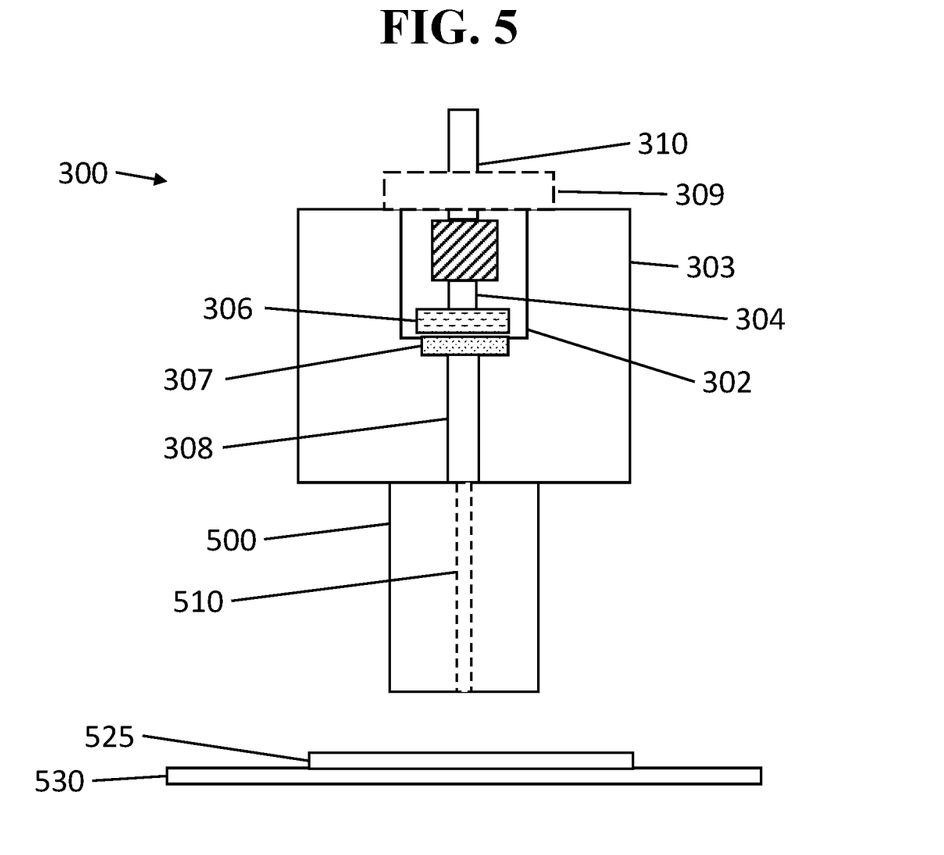
FIG. 5 shows an example OVJP print head as disclosed herein.

FIG. 5 shows an example OVJP print head device that includes an injection block 300 as shown in FIGS. 3-4, which is connected to a print die 500 such as an OVJP print die. The entrained organic material and carrier gas and/or an exhaust vacuum source, may be provided to the injection block from a fixed-position gas distribution system as previously disclosed. The injection block then transfers the organic material and/or vacuum to the print die. Although shown attached below the injection block 300, the print die 500 also may be connected and positioned to one side of the injection block 300, in any configuration known in the art. As previously disclosed herein, the injection block 300 may include an internal gas distribution manifold 308 that distributes carrier gas and/or vacuum to the print die by way of one or more delivery and/or exhaust channels machined in the print die 300, though only a single channel 308 is shown in FIGS. 3C and 5 for ease of illustration. The internal gas distribution manifold 308 may connect to one or more suitable channels, tubes, or the like, represented by 510, within the print die. Although a single channel 510 is shown for ease of illustration, any number of delivery and/or exhaust channels may be used in the print die 500 as is known in the art. During operation, organic material entrained in a carrier gas is ejected from the print die 500 toward a substrate 525 positioned above or below the print die. The substrate 525 may be held in place by a structure 530, which may be a substrate holder such as a physical gripper, a vacuum gripper, a float table, or the like, or combinations thereof. Compared to other systems which may attempt to move the substrate 525 vertically relative to the print head, embodiments disclosed herein provide for more precise control over the print die-to-substrate distance. This is especially true for larger substrates which typically are not sufficiently flat to allow for uniform distance control. For example, it may be desirable to maintain a separation between the substrate and the closest edge of the print die within 25-60 μm, within a tolerance of 1.0 μm or less. Moving a larger substrate relative to the print die may be difficult due to inherent sag and non-uniformity in the substrate itself.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic vapor jet printing (OVJP) device comprising:
 a print die; and
 an injection block comprising:
  an internal recess entirely within the injection block;
  an internal gas distribution manifold to distribute carrier gas and/or vacuum to the print die; and
  a flexible bellows disposed within the internal recess within the injection block and in fluid communication with the internal gas distribution manifold, which allows the injection block to move at least 150 μm vertically relative to a fixed-position gas distribution system while maintaining a fluid connect between the print die and the injection block.

2. The OVJP device of claim 1, wherein the injection block comprises a monolithic block of material and the internal gas distribution manifold comprises one or more channels machined into the monolithic block of material.

3. The OVJP device of claim 1, wherein the flexible bellows allows the injection block to move at least 300 μm vertically while maintaining the fluid connection between the print die and the injection block.

4. The OVJP device of claim 1, further comprising an inner seal in fluid communication with a first end of the flexible bellows and with the internal gas distribution manifold.

5. The OVJP device of claim 4, wherein the internal recess is disposed adjacent to an outer surface of the injection block, and further comprising an outer seal to seal the internal recess from the outer ambient environment and retain heat within the internal recess.

6. The OVJP device of claim 1, further comprising an input tube in fluid communication with the bellows and with a source of carrier gas and/or organic vapor material.

7. The OVJP device of claim 6, wherein the input tube has an inner diameter of at least 0.635 cm.

8. The OVJP device of claim 7, wherein the input tube has an inner diameter of at least 0.7 cm.

9. The OVJP device of claim 1, further comprising a heating element configured to maintain a temperature within the injection block with a variation of 2 C or less.

10. The OVJP device of claim 1, wherein the print die comprises channels etched in a monolithic block, the channels being in fluid communication with the internal gas distribution manifold of the injection block.

* * * * *